United States Patent [19]

Vossen, Jr.

[11] 4,056,457
[45] Nov. 1, 1977

[54] METHOD OF DEPOSITING LOW STRESS HAFNIUM THIN FILMS

[75] Inventor: John Louis Vossen, Jr., Bridgewater, N.J.

[73] Assignee: RCA Corporation, New York, N.Y.

[21] Appl. No.: 724,550

[22] Filed: Sept. 20, 1976

[51] Int. Cl.$^2$ .......................... C23C 15/00; B32B 9/00
[52] U.S. Cl. .................... 204/192 SP; 179/100.41 G; 274/38; 428/469; 358/256
[58] Field of Search ......... 204/192 C, 192 SP, 192 F; 428/469; 178/6.6 A, 6.6 DD; 179/100.41 G; 274/38

[56] References Cited

U.S. PATENT DOCUMENTS 3,647,662   3/1972   Gerstenberg et al. ............... 204/192

OTHER PUBLICATIONS

F. Huber et al., "Thin Film Hafnium–Hafnium Dioxide Capacitors," *Proc. IEEE Components Conf,* (1966), pp. 324–334.

F. T. J. Smith, "Structure & Electrical Properties of Sputtered Films of Hafnium & Hafnium Compounds," *J. Appl. Phys,* vol. 41, pp. 4227–4231, (1970).

M. T. Thomas, "Preparation & Properties of Sputtered Hafnium & Anodic HfO$_2$ Films," *J. Electrochem. Soc.,* vol. 117, pp. 396–403, (1970).

*Primary Examiner*—John H. Mack
*Assistant Examiner*—Aaron Weisstuch
*Attorney, Agent, or Firm*—H. Christoffersen; Birgit E. Morris

[57] ABSTRACT

By radio frequency sputtering hafnium films on an alumina or sapphire substrate at high deposition rates and minimum substrate target bias, improved adhesion of the hafnium films to the substrate is obtained.

7 Claims, No Drawings

METHOD OF DEPOSITING LOW STRESS HAFNIUM THIN FILMS

This invention relates to a method of depositing thin hafnium metal layers on a substrate. More particularly, this invention relates to a method for depositing hafnium metal layers that are strongly adherent to alumina or sapphire substrates.

BACKGROUND OF THE INVENTION

The capacitance video disc system described by Clemens in U.S. Pat. No. 3,842,194, requires a pick-up stylus adapted to track in a very small groove in a vinyl disc record coated with a conductive layer and having a dielectric layer disposed thereover. When relative motion is established between the disc record and the pick-up stylus, the pick-up stylus cooperates with the disc record to establish capacitance variations between the stylus and the record due to geometrical variations in said grooves. The stylus includes a support element with a conductive element disposed on one surface. The support element is shaped in a manner such that when it engages the record medium groove, an edge of the conductive element is adjacent to the dielectric coating. U.S. Pat. No. 3,826,877 to Leedom describes a stylus made by depositing tantalum on a sapphire support. In the manufacture of such styli, the sapphire support is abraded with diamond abrasive to form a grooved surface and tantalum metal is vacuum sputtered over the grooved surface to a thickness of about 1,000 to 2,000 angstroms. Chips are cut in the general size of the stylus. The chips must then be rough lapped to give the approximate shape of the stylus, and then fine lapped to conform the stylus tip to the shape of the groove. The metal film must adhere tightly to the sapphire substrate during these operations and further, the metal-to-substrate bond must survive many hundreds of hours of playing time during which the stylus surface is abraded by the revolving disc. If the metal film detaches from the very edge of the stylus, even for as little as 50 angstroms from the edge of the stylus in contact with the disc, a noticeable and unacceptable reduction in signal output occurs.

Thus it would be desirable to provide the best adhesion between conductive metal films and alumina substrates for this application.

SUMMARY OF THE INVENTION

It has been found that adhesion of hafnium thin layers to alumina or sapphire substrates is maximized by applying said layers by radio frequency vacuum sputtering at maximum rates and minimum substrate target voltages.

DETAILED DESCRIPTION OF THE INVENTION

According to the present process, adherent films of hafnium can be deposited on alumina or sapphire substrates by vacuum radio frequency sputtering at high deposition rates of over 175 angstroms per minute, and preferably at 500 to 2,000 angstroms per minute, while keeping the voltage on the substrate target low; preferably less than 50 volts with respect to plasma. This is done by applying a high voltage to the hafnium deposition target, on the order of about 1500 volts, and maintaining the sputtering gas pressure at about 60 to 100 millitorr, and preferably about 80 millitorr. The target temperatures remain low in this mode which also aids in producing highly adherent films. Temperatures below about 150° C are preferred.

Alumina or sapphire discs are placed on a hafnium substrate target in a conventional radio frequency sputtering chamber. Details of the radio frequency sputtering process and apparatus are described in detail in an article of J. L. Vossen and J. J. O'Neill, *Journal of Vacuum Science Technology*, 12 1052 (1975) and in U.S. Pat. No. 3,860,507 to Vossen, hereby incorporated by reference herein. A deposition target, in this case hafnium, is mounted above the substrate target and a removable shutter is disposed therebetween. Both targets are connected to radio frequency generators.

The chamber is evacuated and an inert gas plasma is added to a pressure of at least about 60 millitorr. A voltage of about 1,000 volts is applied to the hafnium deposition target and sputtering against the shutter is continued for about 20 minutes to clean the system.

The voltage to the hafnium deposition target is increased to about 1500 volts and then the shutter is opened. The rate of sputtering is measured and sputtering is continued until the desired thickness of hafnium on the alumina or sapphire substrate is obtained.

Although the reasons for the good adhesion of films prepared by the present method are not fully understood, it is believed that this method, combining low target temperatures, high deposition rates and low deposition target voltages, ensures a minimum interfacial region between the substrate and the hafnium film. It is believed that stress, which leads to a loss of adhesion, is concentrated in this interfacial region. Thus by making the interface as abrupt as possible, contrary to prior art teachings, stress in the film is minimized and adhesion between the metal layer and the substrate is improved.

Stress is measured herein as compressive stress on unclamped thin beams according to the method of R. W. Hoffman, *Physics of Thin Films*, Vol. 3, page 211 (1966). When stress exceeds about $5 \times 10^9$ dynes/cm$^2$, film adhesion is poor. The present method produces films having stresses less than $1 \times 10^9$ dynes/cm$^2$.

The invention will be further described by the following examples, but the invention is not meant to be limited to the details described therein.

EXAMPLE 1

Two 20 centimeter diameter hafnium discs were mounted by solder-bonding to water-cooled, stainless steel sputtering backing plates. The two plates were mounted 6.3 centimeters apart in a radio frequency sputtering chamber, as referred to above, as the deposition target (the upper target) and the substrate support target (the lower target). Several sapphire wafers about 5 centimeters in diameter were laid on the substrate support target. A removable shutter was mounted about half-way between the depositon target and the substrate support target.

The chamber pressure was reduced to about $1 \times 10^{-7}$ torr and back filled with argon to a pressure of about 80 millitorr.

With the shutter closed, the deposition target was turned on by applying a voltage of about 1,000 volts and sputtering against the shutter continued for about 20 minutes to clean the deposition target surface and the atmosphere of the chamber.

The voltage on the deposition target was then increased to 1500 volts and the shutter opened. The rate of deposition of hafnium was about 500 to 600 angstroms per minute. Sputtering was continued for two minutes to obtain a film of hafnium about 1000 to 1200 angstroms thick on the sapphire discs.

The stress in the resultant film was found to be about 0.5 to 1 × 10$^9$ dynes/cm$^2$.

Adhesion was further tested by gouging a deep scratch with a diamond stylus in a hafnium-coated sapphire disc. The edges of the scratch were examined in a scanning electron microscope at a magnification of 20,000 times. No flaking back of the film layer could be observed.

COMPARATIVE EXAMPLE

The prior art workers have long believed that adhesion of thin metal films to an oxide substrate, e.g. alumina or sapphire, is promoted by chemical bonding between the metal vapor and the substrate. This creates an interfacial reaction zone of metal oxide, graded within this zone to from mostly substrate oxide at one end to mostly metal at the other end. This is not the case with the present material, as the following shows:

The general procedure of Example 1 was followed except that both the hafnium deposition target and the substrate support target were presputtered at 1000 volts for 20 minutes with the shutter closed, and sputtering continued for another 20 minutes under the same conditions with the shutter opened. This method caused the formation of a uniformly graded interfacial zone between the sapphire and the hafnium which was about 350 angstroms thick. The substrate support target voltage was then reduced to near zero and the deposition target voltage was increased to 1500 volts and sputtering continued for 2 minutes.

The total compressive stress in the resultant 1,000 to 2,000 angstroms thick film was 1-2 × 10$^{10}$ dynes/cm$^2$. The film of hafnium was non-adherent to the sapphire substrate as determined by the gouging test.

I claim:

1. A method for depositing adherent films of hafnium metal on an alumina or sapphire substrate which comprises radio frequency vacuum sputtering a hafnium target in an inert gaseous plasma atmosphere at deposition rates of over 175 Angstroms per minute onto said substrate, said substrate being maintained at minimum bias with respect to said plasma atmosphere.

2. A method according to claim 1 wherein sputtering is carried out in said plasma atmosphere of from about 60 to 100 millitorr, and about 1500 volts are applied to the hafnium target.

3. A method according to claim 1 wherein said plasma atmosphere comprises argon maintained at a pressure of about 80 millitorr.

4. A method according to claim 1 wherein the rate of deposition is maintained at over 500 angstroms per minute.

5. A composite comprising a layer of hafnium adhered to a sapphire substrate and deposited by the method of claim 1.

6. A method of depositing adherent hafnium films on alumina or sapphire substrates by radio frequency sputtering which comprises:
   a. evacuating a vacuum chamber fitted for radio frequency sputtering of hafnium metal onto an alumina or sapphire substrate to a pressure of about 1 × 10$^{-7}$ torr,
   b. adding an inert gas to a pressure of from about 60 to about 100 millitorr, and
   c. applying a voltage of about 1500 volts to a hafnium deposition target, thereby sputtering hafnium at a deposition rate of over 175 angstroms per minute and at minimum substrate voltage with respect to the plasma atmosphere.

7. A method according to claim 6 wherein said inert gas is argon and said inert gas pressure is about 80 millitorr.